United States Patent [19]

Taguchi

[11] Patent Number: 4,935,800

[45] Date of Patent: Jun. 19, 1990

[54] SEMICONDUCTOR INTEGRATED CIRCUIT

[75] Inventor: Minoru Taguchi, Yokohama, Japan

[73] Assignee: Kabushiki Kaisha Toshiba, Kawasaki, Japan

[21] Appl. No.: 313,296

[22] Filed: Feb. 21, 1989

Related U.S. Application Data

[63] Continuation of Ser. No. 51,620, May 20, 1987, abandoned.

[30] Foreign Application Priority Data

May 27, 1986 [JP] Japan .................. 61-121617

[51] Int. Cl.$^5$ .................................... H01L 27/12
[52] U.S. Cl. ........................... 357/49; 357/43; 357/47
[58] Field of Search .............. 357/43, 42, 92, 49, 357/47, 59

[56] References Cited

U.S. PATENT DOCUMENTS

| | | | |
|---|---|---|---|
| 4,209,350 | 6/1980 | Ho et al. ................... | 357/49 |
| 4,236,294 | 12/1980 | Anantha et al. ........... | 357/49 |
| 4,238,278 | 12/1980 | Antipov ..................... | 357/49 |
| 4,471,525 | 9/1984 | Sasaki ........................ | 357/49 |
| 4,495,010 | 1/1985 | Kranzer ...................... | 357/49 |
| 4,536,945 | 8/1985 | Gray et al. ................. | 29/571 |
| 4,611,386 | 9/1986 | Goto ........................... | 357/49 |

FOREIGN PATENT DOCUMENTS

| | | | |
|---|---|---|---|
| 0029987 | 6/1981 | European Pat. Off. ....... | 357/43 |
| 58-27356 | 2/1983 | Japan ........................... | 357/92 |

OTHER PUBLICATIONS

Patent Abstracts of Japan, vol. 9, No. 189 (E-33) [1912], Aug. 6, 1985; & JP-A-60 57 950 (Hitachi Seisakusho K. K.) 03-04-1985.

M. Suzuki et al., "A 165 ps/Gate 5000-Gate ECL Gate Array," Japanese Journal of Applied Physics, Supplements 17th Conference on Solid State Devices and Materials, 25th-27th, Aug. 1985, pp. 377-380.

*Primary Examiner*—Andrew J. James
*Assistant Examiner*—Mark Prenty
*Attorney, Agent, or Firm*—Finnegan, Henderson, Farabow, Garrett and Dunner

[57] ABSTRACT

This invention discloses a semiconductor integrated circuit in which an analog circuit and a digital circuit are formed on a single chip. The semiconductor integrated circuit includes a p-type semiconductor region, an n$^+$-type buried region formed on the p-type semiconductor region, an n-type semiconductor region formed on the n$^+$-type buried region, a first isolation portion, extending through the n-type semiconductor region and the n$^+$-type buried region and reaching the p-type semiconductor region, for isolating adjacent transistors in an analog circuit formed on the n-type semiconductor region, and a second isolation portion, formed in the n-type semiconductor region, for isolating adjacent transistors in the n-type semiconductor region.

9 Claims, 3 Drawing Sheets

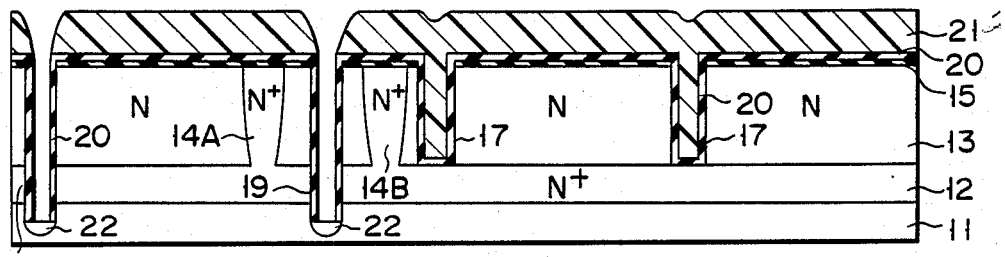
F I G. 1D
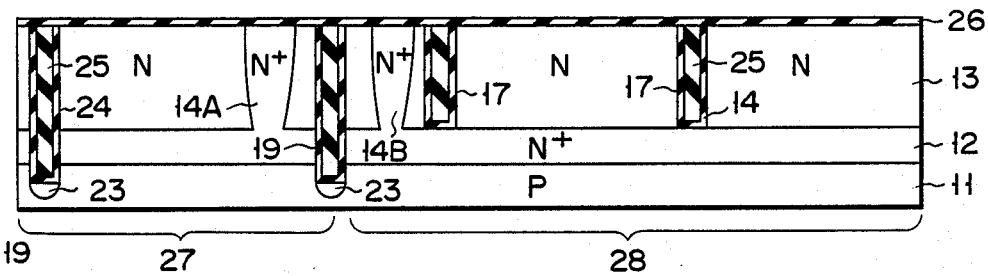
F I G. 1E
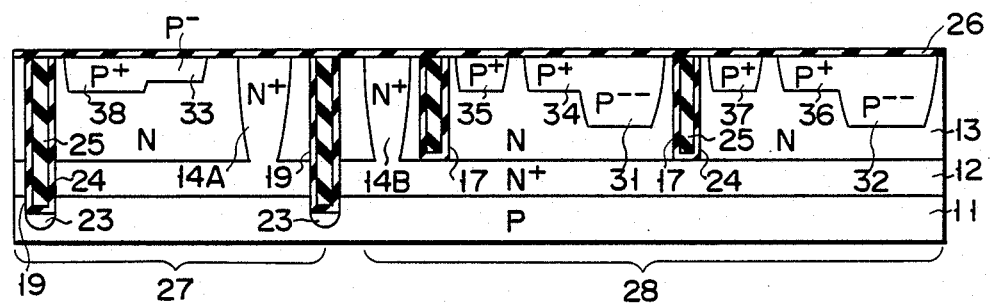
F I G. 1F
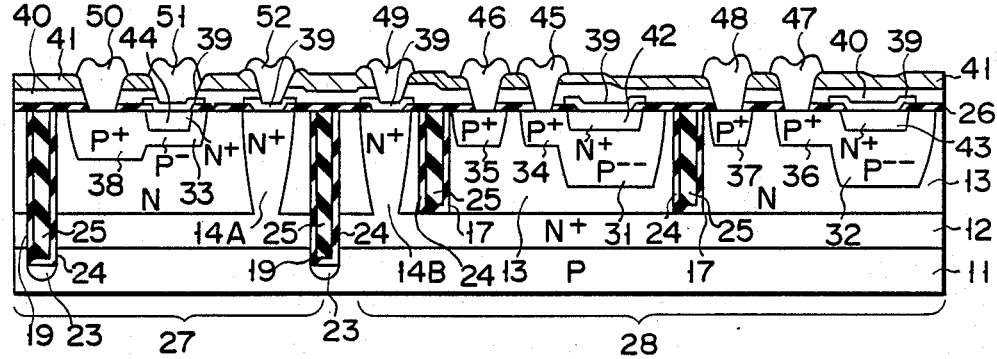
F I G. 1G

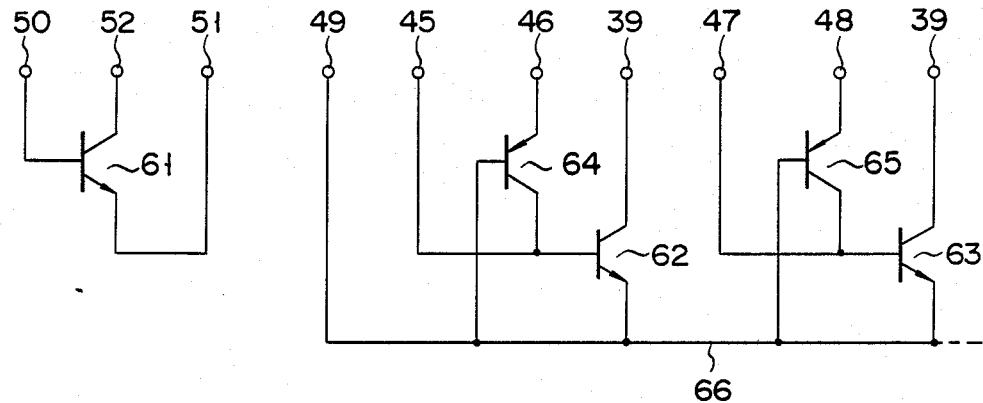
F I G. 2
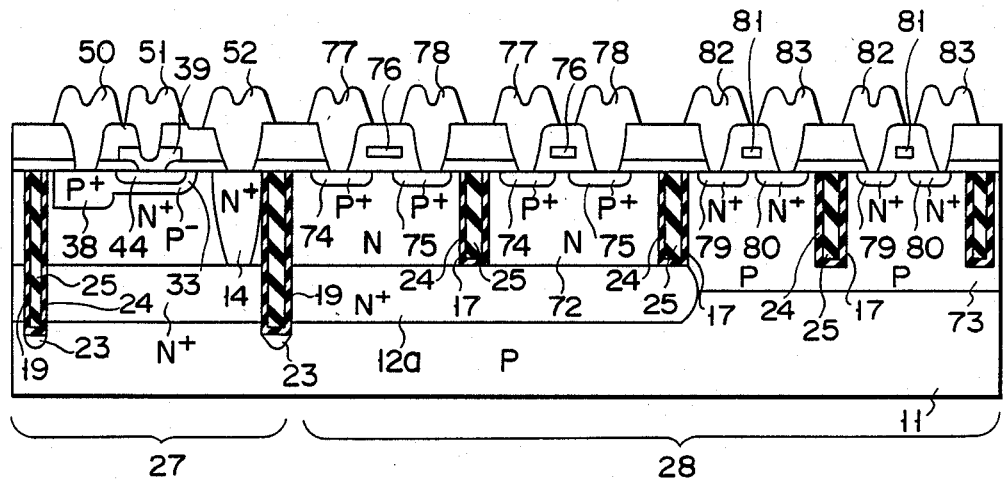
F I G. 3

SEMICONDUCTOR INTEGRATED CIRCUIT

This application is a continuation of application Ser. No. 051,620, filed May 20, 1987 and now abandoned.

BACKGROUND OF THE INVENTION

The present invention relates to a semiconductor integrated circuit and, more particularly, to a hybrid semiconductor integrated circuit in which semiconductor elements are isolated by the trench isolation method, and analog and digital circuits are formed on a single chip.

The trench isolation method is a known conventional method of isolating semiconductor elements. Using the trench isolation method, a vertical trench is formed on a semiconductor substrate by reactive ion etching (to be referred to as RIE hereinafter), a dielectric (insulation material) is selectively left in this trench, thereby utilizing it for element isolation.

Using the trench isolation method, a trench having a small pattern transfer difference can be formed at an arbitrary depth. Since a dielectric is filled into the trench, the parasitic capacitance is decreased as compared with other p-n junction isolation methods. For this reason, trench isolation is widely used for VLSIs.

However, when transistors are isolated by use of the trench isolation method, they are completely isolated from each other. Thus, in the case of a bipolar semiconductor integrated circuit which requires an electrode for providing a reference voltage to be formed on the lower surface of a chip, an integrated injection logic circuit (hereinafter referred to as an I$^2$L circuit), which is a digital circuit, cannot be formed on a single chip.

The reason the I$^2$L circuit cannot be formed is that the emitters of vertical transistors, each of which uses an n-type conductive buried layer, are completely isolated from each other. Particularly in the case where analog and digital circuits are formed together on a single chip, the above-described situation presents serious problem.

Thus, a conventional I$^2$L circuit is arranged by leading electrodes from the emitters of the respective transistors, to connect them each other by way of lines. Elements, however, cannot be micropatterned by such a method.

SUMMARY OF THE INVENTION

It is an object of the present invention to provide a semiconductor integrated circuit in which, when analog and digital circuits are formed on a single chip, each element can be adequately isolated, and an IC can be miniaturized.

A semiconductor integrated circuit according to the present invention comprises a first semiconductor region, containing an impurity of a first conductivity type; a first high-impurity semiconductor region, formed on the first semiconductor region and containing an impurity of a second conductivity type at a high concentration; a second high impurity semiconductor region, containing an impurity of a second conductivity type, formed on the first semiconductor region; a third high-impurity semiconductor region, containing an impurity of a second conductivity type, formed on the second high-impurity semiconductor region; a first isolation portion, extending through the third semiconductor region and the second semiconductor region, and reaching the first semiconductor region, for isolating each transistor of an analog circuit formed in the third semiconductor region; and a second isolation portion for isolating each transistor of a digital circuit formed in the third semiconductor region.

According to a semiconductor integrated circuit of the present invention, analog and digital circuits are formed on a single chip, and each transistor of the analog circuit is isolated by the first isolation portion extending through the third semiconductor region and the second high impurity semiconductor region, and reaching the first semiconductor region, thereby completely isolating each transistor of the analog circuit.

Thus, a parasitic capacitance between the adjacent transistors can be reduced so as to improve the overall characteristics of the analog circuit.

Since each transistor of the digital circuit is isolated by the second isolation portion formed in the third semiconductor region, the second high-impurity semiconductor region can be commonly used by each transistor of the digital circuit.

Therefore, the second high-impurity semiconductor region can be used as a common emitter for each transistor, thereby micropatterning the elements.

BRIEF DESCRIPTION OF THE DRAWINGS

FIGS. 1A to 1G are sectional views for explaining the steps in manufacturing a semiconductor integrated circuit according to the present invention, in which FIG. 1A is a sectional view wherein an n$^+$-type buried layer, n-type semiconductor regions, and n$^+$-type diffused layers are formed on a p-type silicon substrate, and a thermal oxide film is formed on the n-type semiconductor regions;

FIG. 1B is a sectional view wherein the thermal oxide film shown in FIG. 1A is etched using a patterned photoresist film as a mask, and second trenches as second isolation portions are formed on the n-type semiconductor regions;

FIG. 1C is a sectional view wherein, after the above photoresist film is entirely removed, first trenches are formed as first isolation portions in the same manner as in FIG. 1B, by using another patterned photoresist film;

FIG. 1D is a sectional view wherein, after the above photoresist film is completely removed, an undoped CVD-SiO$_2$ film is deposited, and portions thereof remaining in the bottom regions of the second trenches are selectively etched by using a photoresist having openings corresponding to the positions of the second trenches, so as to form boron ion-implanted regions in the bottom regions of the second trenches;

FIG. 1E is a sectional view wherein, after the above photoresist is entirely removed and the ion-implanted regions are converted into p$^+$-type diffused regions by annealing, an insulating film is formed on the surface of a silicon oxide film on side surfaces of the first and second trenches, an undoped polysilicon layer is filled into the first and second trenches, the surfaces of the n-type semiconductor regions are exposed, and a thermal oxide film is then formed;

FIG. 1F is a sectional view wherein boron ions are implanted into the n-type semiconductor regions, to form p$^{---}$-type diffused regions, a p$^-$-type diffused region, and p$^+$-type diffused regions; and FIG. 1G is a sectional view wherein a semiconductor circuit is finished by forming n$^+$-type diffused regions in the p$^-$-type diffused region and the p$^{---}$-type diffused regions, and by forming metal electrodes;

FIG. 2 is a circuit diagram showing an equivalent circuit of the semiconductor integrated circuit shown in FIG. 1G; and FIG. 3 is a sectional view showing another embodiment of the invention.

DETAILED DESCRIPTION OF THE PREFERRED EMBODIMENTS

Figure 1A:
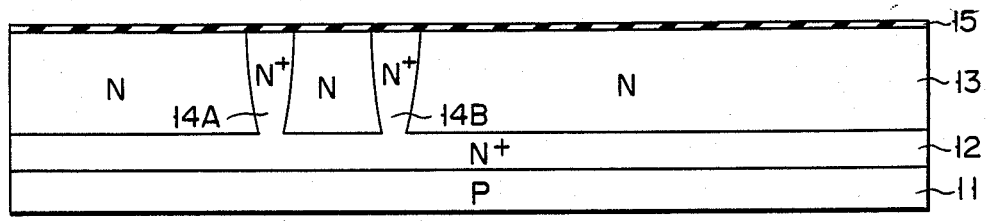
Figure 1B:
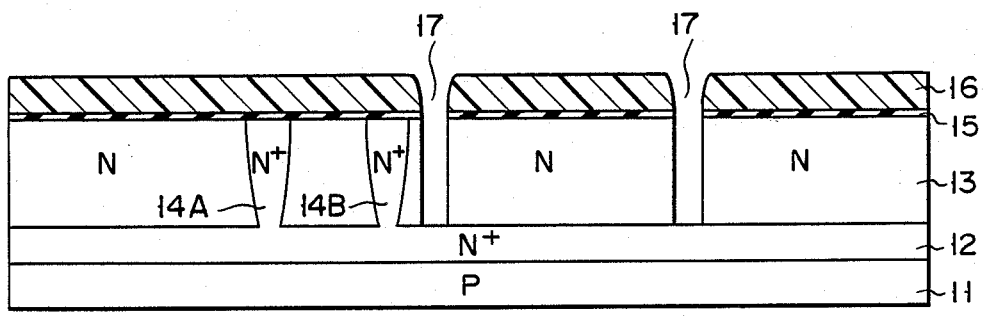

The structure and a method of manufacturing a semiconductor integrated circuit according to an embodiment of the present invention will now be described, with reference to FIGS. 1A to 1G.

First 4-$\mu$m thick n+-type buried layer 12 containing an n-type impurity such as antimony (Sb) of a high dose, e.g., $10^{19}/cm^2$, and having a sheet resistance $\rho s \approx 20$ $\Omega$cm is deposited on p-type silicon substrate 11. After this, 2-$\mu$m thick n-type semiconductor region 13 containing an n-type impurity such as phosphorus of a low dose, e.g., $3 \times 10^{15}/cm^2$, and having a sheet resistance of $\rho s \approx 2$ $\Omega$cm is deposited on n+-type buried layer 12, by epitaxial growth. Then, impurity ions are selectively diffused into n-type diffused region 13, to a depth of about 2.5 $\mu$m, by using a P-As silicate glass (not shown) containing phosphorus and arsenic, or the like as a diffusion source, so as to form n+-type diffused layers 14A and 14B whose bottom portions reach n+-type buried layers 12. After this, thermal oxidation is performed in an oxygen atmosphere at 1,000° C., to form 3,000-Å thick thermal oxide film 15 on the surface of n-type semiconductor region 13.

Photoresist film 16 is formed on the entire surface, and is then patterned. Unmasked portions of thermal oxide film 15 are selectively removed in a CF$_4$ and H$_2$ gas atmosphere, by the RIE method using patterned photoresist film 16 as a mask. In addition, 2-$\mu$m deep vertical trenches 17 as second isolation portions are formed in region 13 at an RF power of 150 W/unit area chlorine gas (C$_{12}$) and hydrogen gas (H$_2$). In this case, since n-type semiconductor region 13 has a thickness of 2 $\mu$m, trenches 17 are formed such that the bottom portions thereof reach n+-type buried layer 12 under n-type semiconductor region 13 (shown in FIG. 1B).

Figure 1C:
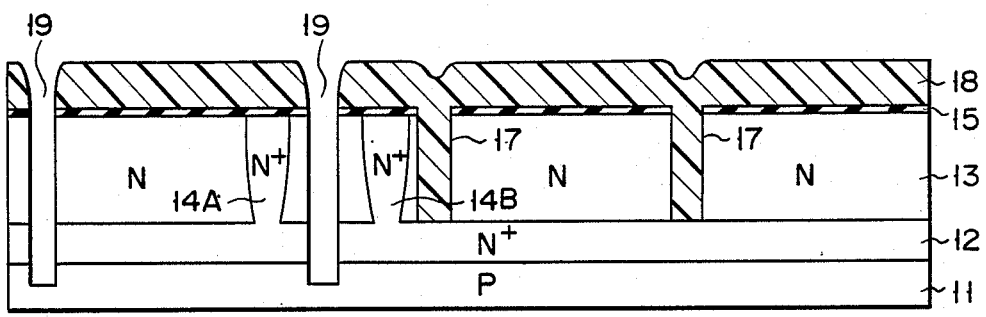

After photoresist 16 is completely removed, another photoresist film, 18, is formed and patterned. Then, after thermal oxide film 15 is etched by means of the RIE method, in the same manner as described above, vertical trenches 19 having a depth of 7 m are formed as first isolation portions, again by means of the RIE method. In this case, since photoresist film 18 is filled in trenches 17 formed in the previous step, trenches 17 are not further etched. N-type semiconductor region 13 and n+-type buried layer 12 have thicknesses of 2 $\mu$m and 4 $\mu$m, respectively. For this reason, trenches 19 are formed such that the bottom portions thereof extend through n-type semiconductor region 13 and n+-type buried layer 12, and reach p-type silicon substrate 11 (FIG. 1C). Note that trenches 17 may be formed before trenches 19.

Next, photoresist film 18 is completely removed, and a silicon oxide film not containing an impurity, i.e., so-called undoped silicon oxide film 20, having a thickness of 1,000Å, is deposited by the chemical vapor deposition method (to be referred to as the CVD method hereinafter). At this time, undoped silicon oxide film 20 is deposited on the wall surfaces of trenches 17 and 19. Then, photoresist film 21 is formed on the surface of oxide film 20 again, and patterning is performed to form openings at positions corresponding to only trenches 19 having a depth greater than that of trenches 17. Undoped oxide film 20 present in trenches 19 is selectively etched by the RIE method, using patterned photoresist film 21 as a mask. When photoresist film 20 is patterned, it is known that an alignment error always occurs with respect to trenches 19. However, since a two-layer film consisting of thermal oxide film 15 and undoped silicon oxide film 20 is formed on the surfaces of n-type semiconductor region 13, even if an alignment error occurs between patterned photoresist film 21, and hence the openings are misaligned in relation to trenches 19, the two-layer film serves as a protective barrier against etching, thereby preventing n-type semiconductor region 13 from being exposed. Then, impurity ions are implanted, using photoresist film 21 and thermal oxide film 15 as masks, at an acceleration voltage of 50 keV and a dose of $1 \times 10^{15}/cm^2$, so as to form ion-implanted regions 22 (shown in FIG. 1D).

Next, photoresist film 21 is completely removed. The resultant structure is thermally annealed in a nitrogen atmosphere at 1,000° C., so that ion-implanted regions 22 are activated and converted into p+-type diffused regions 23. Then, thermal oxidation is performed in an oxygen atmosphere at 1,000° C., to form a 1,000-Å thick thermal oxide film. By forming the thermal oxide film in this manner, two-layer insulating film 24 consisting of undoped silicon oxide film 20 and this thermal oxide film are formed on the wall surfaces of trenches 17 and 19. Additionally, undoped polysilicon layer 25 is deposited by use of the CVD method. In this case, undoped polysilicon layer 25 is deposited to a thickness at which the layer completely fills trenches 17 and 19. For example, if trenches 17 and 19 are formed to have a width of 1 $\mu$m, the thickness of undoped polysilicon layer 25 is set to be greater than half the width of the trenches, e.g., 7,000Å. After this, a photoresist film is formed on the surface of the resultant structure, and the deposited layer consisting of undoped silicon oxide film 20 and thermal oxide film 15, formed on the surface of n-type semiconductor region 13, is etched. Then, after the surface of n-type semiconductor region 13 is exposed, thermal oxidation is performed again in an oxygen atmosphere at 1,000° C., to form 1,000-Å thick thermal oxide film 26.

After this, the region where trenches 19 are formed serves as analog circuit region 27 where transistors for the analog circuit are formed. The region where trenches 17 are formed serves as digital circuit region 8 where transistors for the digital circuit are formed (shown in FIG. 1E).

Boron ions are implanted into n-type semiconductor region 13 of analog and digital circuit regions 27 and 8, to activate them, thereby sequentially forming p$^{---}$-type diffused regions 31 and 32, p$^{-}$-type diffused region 33, p+-type diffused regions 34, 35, 36, 37, and 38. More specifically, boron ions are implanted twice, i.e., first, at an acceleration voltage of 40 keV and a dose of $2 \times 10^{12}/cm^2$; second, at an acceleration voltage of 200 keV and a dose of $2 \times 10^{12}/cm^2$, so as to form ion-implaned regions (not shown) for p$^{---}$-type diffused regions 31 and 32. Next, impurity ions are implanted at an acceleration voltage of 40 keV and a dose of $3 \times 10^{13}/cm^2$, to form an ion-implanted region (not shown) for p$^{-}$-typed diffused region 33. In addition, impurity ions are implanted at an acceleration voltage of 40 keV and a dose of $1 \times 10^{15}/cm^2$, to form ion-implanted regions (not shown) for p+-type diffused regions 34, 35, 36, 37, and 38. P$^{---}$-type diffused regions 31 and 32 are formed deeper than p+-type diffused regions 34, 35, 36, 37, and 38 (FIG. 1F).

Next, thermal oxide film 26 is selectively removed by etching, to partially expose the surfaces of p⁻⁻⁻-type diffused regions 31 and 32, and p⁻-type diffused region 33. Then, polysilicon containing arsenic (As) having a dose of $1 \times 10^{20}$/cm$^3$ as an n-type impurity is deposited, and the resultant structure is thermally annealed to form 3,500-Å thick n+-type polysilicon layer 39. After this, n+-type polysilicon layer 39 is patterned. Then, silicon oxide film 40 having a thickness of 5,000Å is deposited by means of the CVD method, and 7,000-Å thick phosphosilicate glass (to be referred to as PSG) 41 is deposited thereon, also by use of the CVD method. Conventional phosphorus gettering and diffusion from n+-type polysilicon layer 39 are performed to form n+-type diffused regions 42, 43, and 44, respectively, inside p⁻⁻⁻-type diffused regions 31 and 32, and p⁻-type diffused region 33. PSG film 41 and silicon oxide film 40 are selectively etched to form contact holes. Then, an electrode material such as aluminum is deposited by vacuum deposition or the like, and is patterned to form metal electrodes 45 to 52. After this, a semiconductor integrated circuit is finished by sintering (FIG. 1G).

The semiconductor integrated circuit having the structure shown in FIG. 1G, p⁻-type diffused region 33, in analog circuit region 27, serves as a base region, n+-type diffused region 44 serves as an emitter region, n-type semiconductor region 13 serves as a collector region, and p+-type diffused region serves as a base contact region, thereby forming an npn transistor having metal electrodes 50, 51, and 52, respectively, as its base, emitter, and collector electrodes. This npn transistor is isolated from other transistors by trenches 19.

In digital circuit region 28, an I²L gate is formed consisting of a vertical npn transistor and a lateral pnp transistor for injection. The vertical transistor has p⁻⁻⁻-type diffused region 31, n+-type diffused region 42, n-type semiconductor region 13, and p+-type diffused region 34, respectively serving as its base, collector, emitter, and base contact regions. The lateral pnp transistor for injection has p+-type diffused region 35, n-type semiconductor region 13, and p+-type diffused region 34, respectively serving as its emitter, base, and collector regions. Another I²L gate is formed consisting of a vertical npn transistor and a lateral pnp transistor for injection. The vertical transistor has p⁻⁻⁻-type diffused region 32, n+-type diffused region 43, n-type semiconductor region 13, and p+-type diffused region 36, respectively serving as its base, collector, and emitter, and base contact regions. The lateral transistor for injection has p+-type diffused region 37, n-type semiconductor region 13, and p+-type diffused region 36, respectively serving as its emitter, base, and collector regions. Metal electrode 45 serves as one input electrode; metal electrode 47, as the other input electrode; metal electrodes 46 and 48, as injection electrodes; and polysilicon layers 39 left in n+-type diffused regions 42 and 43, as an output electrode. Metal electrode 49, formed on the surface of n+-type diffused region 14B which is formed to reach n+-type buried layer 12, serves as a common emitter electrode. The I²L gate consisting of the above vertical and lateral transistors is isolated from the other I²L gate by trenches 17. Analog circuit region 27 and digital circuit region 28 are isolated from each other by trenches 19.

FIG. 2 is an equivalent circuit of a semiconductor integrated circuit having the cross sectional structure shown in FIG. 1G. Referring to FIG. 2, npn transistor 61 is the one which is formed in analog circuit region 27. Transistor 61 is isolated from other transistors by trenches 19, in the above-described manner. Since trenches 19 reach the inside n-type semiconductor region 13, as described above, analog circuit region 28 is completely isolated from other transistors. Therefore, the parasitic capacitance between the respective transistors can be reduced, thereby improving its overall electrical characteristics as an analog circuit. Note that p+-type diffused regions 23 are formed on the bottom region of trenches 19 in FIG. 1G, so that a parasitic transistor consisting of p-type silicon substrate 11 and n+-type buried layer does not have to be formed.

On the other hand, npn transistors 62 and 63 in FIG. 2 serve as the vertical transistors of the I²L gate formed in digital circuit region 28, and pnp transistors 64 and 65 serve as the lateral transistors for injection of the I²L gate. The I²L gates are isolated from each other by shallow trenches 17 reaching n+-type buried layer 12. Thus, an influence of the parasitic capacitance between the I²L gates can be reduced. In addition, since n+-type buried layer 12 used as a common emitter is not isolated from each other, lines 66 in FIG. 2 can be arranged continuously. Therefore, elements can be micropatterned, as compared with a conventional case in which electrodes are respectively led and connected to the emitters.

The present invention is not limited to the particular embodiment described above, and changes and modifications may be made within the spirit and scope of the present invention. For example, in the above embodiment, although the case is explained in which a bipolar transistor is formed in analog circuit region 27, and an I²L gate circuit is formed in digital circuit 28, an MOS logic circuit or Bi-CMOS logic circuit may be formed.

FIG. 3 is a cross sectional view of an arrangement in which the present invention is applied to a Bi-MOS logic circuit. In this embodiment, n+-type buried layer 12a is formed on a part of p-type silicon substrate 11, n-type well layer 72 is formed on n+-type buried layer 12a, and p-type epitaxial layer 73 is formed on silicon substrate 11 excepting n+-type buried layer 12a. In analog circuit region 27, an npn transistor is formed to have p⁻-type diffused region 33, n+-type diffused 44, n-type diffused layer 14, and p+-type diffused region 38, respectively serving as base, emitter, collector, and base contact regions. The npn transistor is isolated from other transistors in analog circuit region 27 by deep trenches 19 reaching p-type silicon substrate 11. Analog circuit region 27 and digital circuit region 28 are isolated from each other by deep trenches 19 reaching p-type silicon substrate 11.

In digital circuit region 28, p-channel MOS transistors and n-channel MOS transistors are respectively formed in n-type well layer 72 and p-type epitaxial layer 73. More precisely, a plurality of p-channel MOS transistors having p+-type diffused regions 74 and 75 as source and drain regions are formed in n-type well layer 72. Note that reference numerals 76 denote n+-type polysilicon layers serving as gate electrodes of these p-channel MOS transistors; and, 77 and 78, source and drain electrodes made of aluminum. A plurality of n-channel MOS transistors having n+-type diffused regions 79 and 80, respectively serving as source and drain regions, are formed in p-type epitaxial layer 73. Note that reference numerals 80 denote n+-type polysilicon layers serving as gate electrodes made of these n-channel MOS transistors; and 82 and 83, source and drain electrodes mode of aluminum.

Trenches 17, whose bottom regions reach silicon substrate 11, are formed between the respective p-channel MOS transistors and also between the respective n-channel MOS transistors.

In this embodiment, the bipolar transistors of the analog circuit are completely isolated from each other by trenches 19, in the same manner described in the first embodiment. As a result, the parasitic capacitance between the adjacent transistors can be reduced, and the overall electrical characteristics of this circuit, as an analog circuit, can be improved.

What is claimed is:

1. A semiconductor integrated circuit comprising:
   a first semiconductor region containing an impurity of a first conductivity type;
   a first high-impurity semiconductor region formed on said first semiconductor region and containing an impurity of a second conductivity type at a concentration higher that a concentration of an impurity of a second conductivity type in a second semiconductor region;
   said second semiconductor region formed on said first high-impurity semiconductor region;
   an analog circuit region and a digital circuit region formed on a surface of said second semiconductor region;
   a first isolation portion extending through said second semiconductor region and said first high-impurity semiconductor region into said first semiconductor region for isolating from each other adjacent transistors formed in said analog circuit region and also for isolating said analog circuit region from said digital circuit region; and
   a second isolation portion, formed of an oxidized buried layer in said second semiconductor region, reaching said first high-impurity semiconductor region for isolating adjacent transistors formed in said digital circuit region.

2. A circuit according to claim 1, wherein a first high-impurity region of the second conductivity type comprising a first isolating region is formed in a portion of said second semiconductor region where said analog circuit region is formed, said first high-impurity region extending through said second semiconductor region to said first high-impurity semiconductor region and a second high-impurity region of the second conductivity type comprising a second isolating region is formed in a portion of said second semiconductor region where said digital circuit region is formed, extending through said second semiconductor region to said first high-impurity semiconductor region.

3. A circuit according to claim 1, wherein said first isolation portion comprises a first trench vertically formed in said first semiconductor region, in said first high-impurity semiconductor region and in said second semiconductor region, an insulating film formed on a wall surface of said first trench and filling a surface portion thereof, and a polysilicon layer totally filling a remaining portion of said first trench.

4. A circuit according to claim 1, wherein said second isolation portion comprises a trench vertically formed in said second semiconductor region, an insulating film formed on a wall surface of said trench and filling a surface portion thereof, and a polysilicon layer totally filling a remaining portion of said trench.

5. A semiconductor integrated circuit comprising:
   a first semiconductor region containing an impurity of a first conductivity type;
   a first high-impurity semiconductor region, formed on part of a first semiconductor region and containing an impurity of a second conductivity type at a concentration higher than a concentration of an impurity of a second conductivity type in a second semiconductor region;
   said second semiconductor region formed on said first high-impurity semiconductor region;
   a third semiconductor region formed on said first semiconductor region adjacent to said second semiconductor region and containing said impurity of the first conductivity type;
   an analog and a first digital circuit region formed is a surface of said second semiconductor region;
   a second digital circuit region formed in a surface of said third semiconductor region;
   a first isolation portion extending through said second semiconductor region and said first high-impurity semiconductor region into said first semiconductor region, for isolating adjacent transistors formed in said analog circuit region, from each other, and also for isolating said analog circuit region from said first digital circuit region;
   a second isolation portion, formed of an oxidized buried layer in said second semiconductor region, said second isolation portion extending through said second semiconductor region and to said first high-impurity semiconductor region, said second isolation portion isolating adjacent transistors formed in said digital circuit region, from each other, and also for isolating said first digital circuit region from said second digital circuit region; and
   a third isolation portion formed in said third semiconductor region, said third isolation portion being formed of an oxidized buried layer in said third semiconductor region, said third isolation portion isolating adjacent transistors formed in said second digital circuit region from each other.

6. A circuit according to claim 5, wherein said third isolation portion comprises a first trench vertically formed in said third semiconductor region, an insulating film formed on a wall surface of said first trench and filling a surface portion thereof, and a polysilicon layer totally filling a remaining portion of said first trench.

7. A circuit according to claim 5 wherein a second high-impurity semiconductor region is formed in said first semiconductor region, at a bottom of said first isolation portion, and contains said impurity of the first conductivity type at a concentration higher than a concentration of an impurity of a first conductivity type on said first semiconductor region.

8. A circuit according to claim 5, wherein said first isolation portion comprises a first trench vertically formed in said first semiconductor region, in said first high-impurity semiconductor region, and in said second semiconductor region, an insulating film formed on a wall surface of said first trench and filling a surface portion thereof, and a polysilicon layer totally filling a remaining portion of said first trench.

9. A circuit according to claim 5, wherein said isolation portion comprises a trench vertically formed in said first semiconductor region, in said high impurity semiconductor region and in said second semiconductor region, an insulating film formed on a wall surface of said trench and filling a surface portion thereof, and a polysilicon layer totally filling a remaining portion of said trench.

* * * * *